(12) United States Patent
Ikeda

(10) Patent No.: US 11,611,340 B2
(45) Date of Patent: Mar. 21, 2023

(54) DRIVE CIRCUIT AND SEMICONDUCTOR DEVICE

(71) Applicant: Mitsubishi Electric Corporation, Tokyo (JP)

(72) Inventor: Naoki Ikeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/717,320

(22) Filed: Apr. 11, 2022

(65) Prior Publication Data

US 2023/0032193 A1 Feb. 2, 2023

(30) Foreign Application Priority Data

Jul. 27, 2021 (JP) .............................. JP2021-122545

(51) Int. Cl.
| | |
|---|---|
| *H02M 1/08* | (2006.01) |
| *H02M 1/32* | (2007.01) |
| *H03K 17/16* | (2006.01) |
| *H03K 17/567* | (2006.01) |
| *H03K 17/687* | (2006.01) |
| *H03K 17/04* | (2006.01) |

(52) U.S. Cl.
CPC ............ *H03K 17/567* (2013.01); *H02M 1/08* (2013.01); *H02M 1/32* (2013.01); *H03K 17/04* (2013.01); *H03K 17/163* (2013.01); *H03K 17/687* (2013.01)

(58) Field of Classification Search
CPC .......... H02M 1/08; H02M 1/32; H03K 17/04; H03K 17/163; H03K 17/567; H03K 17/687
USPC .................................................. 327/108, 109
See application file for complete search history.

(56) References Cited

U.S. PATENT DOCUMENTS 10,461,730 B1 * 10/2019 Mariconti ............ H03K 17/168
2019/0363706 A1 * 11/2019 Shinomiya ............. H03K 17/06

FOREIGN PATENT DOCUMENTS

| JP | 2003-158868 A | 5/2003 |
|---|---|---|
| JP | 2011-166920 A | 8/2011 |

* cited by examiner

*Primary Examiner* — William Hernandez
(74) *Attorney, Agent, or Firm* — Studebaker & Brackett PC

(57) ABSTRACT

A drive circuit includes a second drive circuit that drives a semiconductor switching element in a case where a pulse width of a corresponding signal is determined to be larger than a second threshold, and a timing adjustment circuit that adjusts a timing at which the second drive circuit cooperates with a first drive circuit to drive the semiconductor switching element during a turn-off period of the semiconductor switching element due to drive of the first drive circuit.

8 Claims, 10 Drawing Sheets

F I G. 2
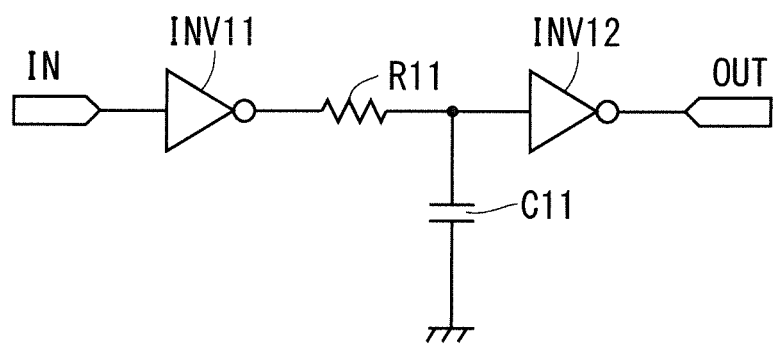

F I G. 3
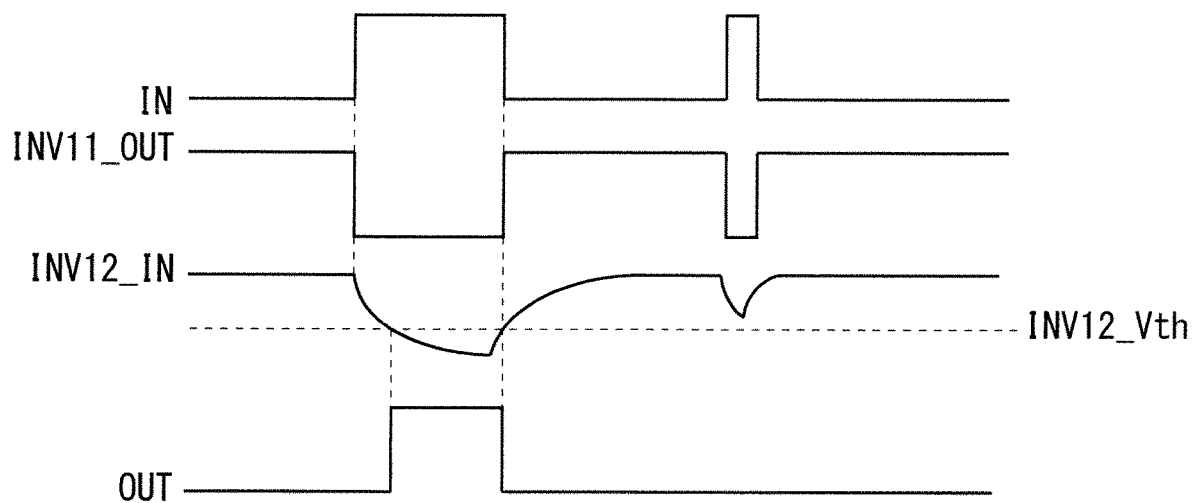

F I G. 5
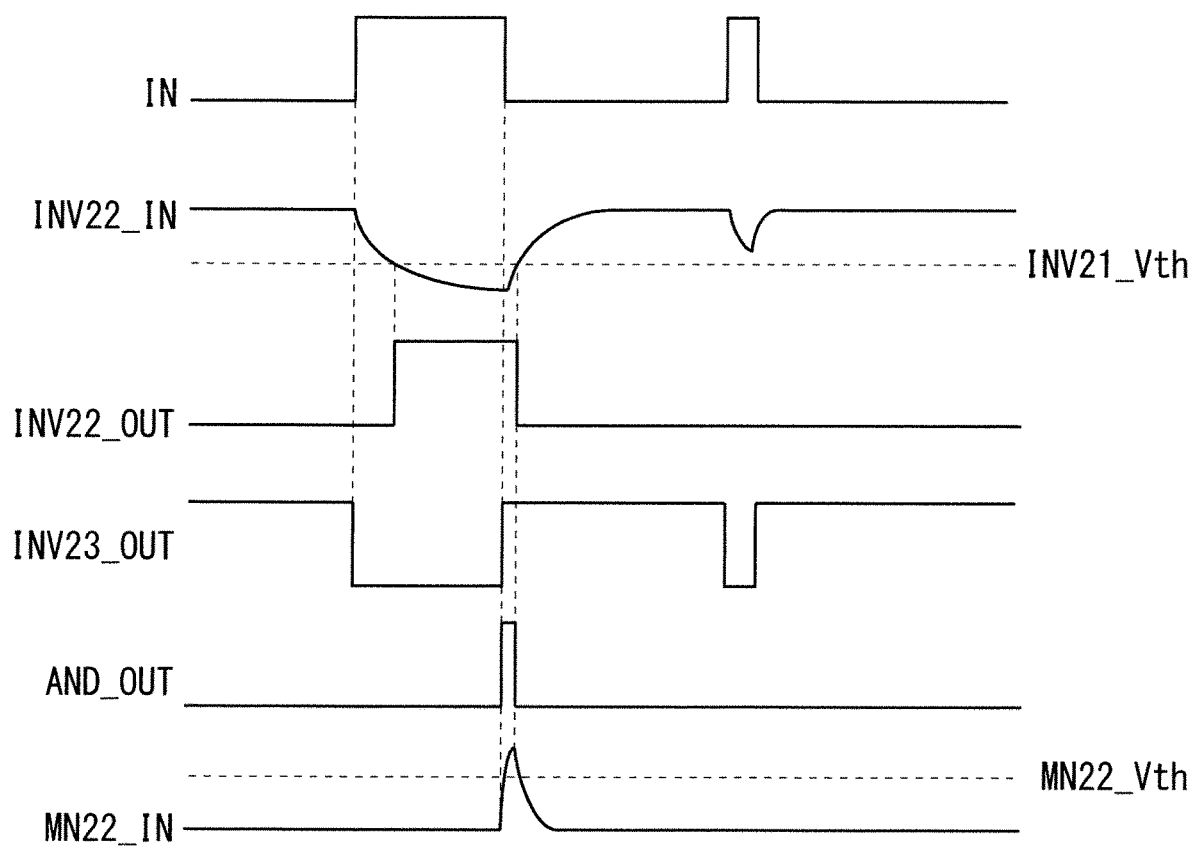

F I G. 9
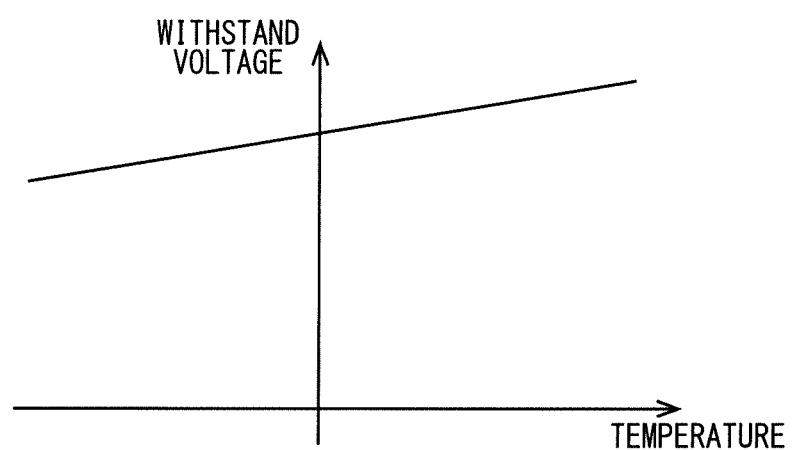

DRIVE CIRCUIT AND SEMICONDUCTOR DEVICE

BACKGROUND OF THE INVENTION

Field of the Invention

The present disclosure relates to a drive circuit and a semiconductor device.

Description of the Background Art

It has been reported that, in a case where a power semiconductor element such as an insulated gate bipolar transistor (IGBT) is turned on and off based on an input signal having a small pulse width, a voltage increases, that is, a surge voltage is generated at turn-off.

In order to solve this problem, for example, Japanese Patent Application Laid-Open No. 2003-158868 proposes a technique of varying the drive capability in a case where a gate voltage of an IGBT is higher than a reference voltage. Further, for example, Japanese Patent Application Laid-Open No. 2011-166920 proposes a technique of varying the drive capability by varying a gate resistance on the basis of a comparison between a control pulse width and a threshold and a comparison between device temperature estimation information and a temperature threshold in consideration of the influence of voltage variation due to a temperature.

In a case where a pulse width of an input signal is small, it is preferable to lower the drive capability in order to prevent a surge voltage from becoming high. In contrast, in a case where a semiconductor switching element operates at a high temperature, it is preferable to make the drive capability high in order to prevent a switching loss from becoming large. However, the conventional technique has a problem that it is not possible to appropriately achieve both the reduction of a switching loss and the suppression of a surge voltage at turn-off.

SUMMARY

The present disclosure has been made in view of the above problem, and an object of the present disclosure is to provide a technique capable of appropriately achieving both reduction in a switching loss and suppression of a surge voltage at turn-off.

A drive circuit according to the present disclosure is a drive circuit that drives a semiconductor switching element. The drive circuit includes a first determination circuit that determines whether or not a pulse width of an input signal to the drive circuit is larger than a first threshold, a first drive circuit that drives the semiconductor switching element based on a corresponding signal that is a signal corresponding to the input signal in which the pulse width is determined to be larger than the first threshold, one or more second determination circuits that determine whether or not a pulse width of the corresponding signal is larger than a second threshold, one or more second drive circuits that drive the semiconductor switching element in a case where the pulse width of the corresponding signal is determined to be larger than the second threshold, and one or more timing adjustment circuits that adjust a timing at which one or more of the second drive circuits cooperate with the first drive circuit to drive the semiconductor switching element during a turn-off period of the semiconductor switching element due to drive of the first drive circuit.

It is possible to appropriately achieve both the reduction of a switching loss and the suppression of a surge voltage at turn-off.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a circuit diagram illustrating a configuration example of a first input width determination circuit according to the first preferred embodiment;

FIG. 3 is a timing chart illustrating an operation example of the first input width determination circuit according to the first preferred embodiment;

FIG. 5 is a timing chart illustrating an operation example of the sub-circuit unit according to the first preferred embodiment;

FIG. 9 is a diagram illustrating an example of a temperature characteristic of a withstand voltage of a semiconductor switching element according to the first preferred embodiment.

DESCRIPTION OF THE PREFERRED EMBODIMENTS

Figure 1:
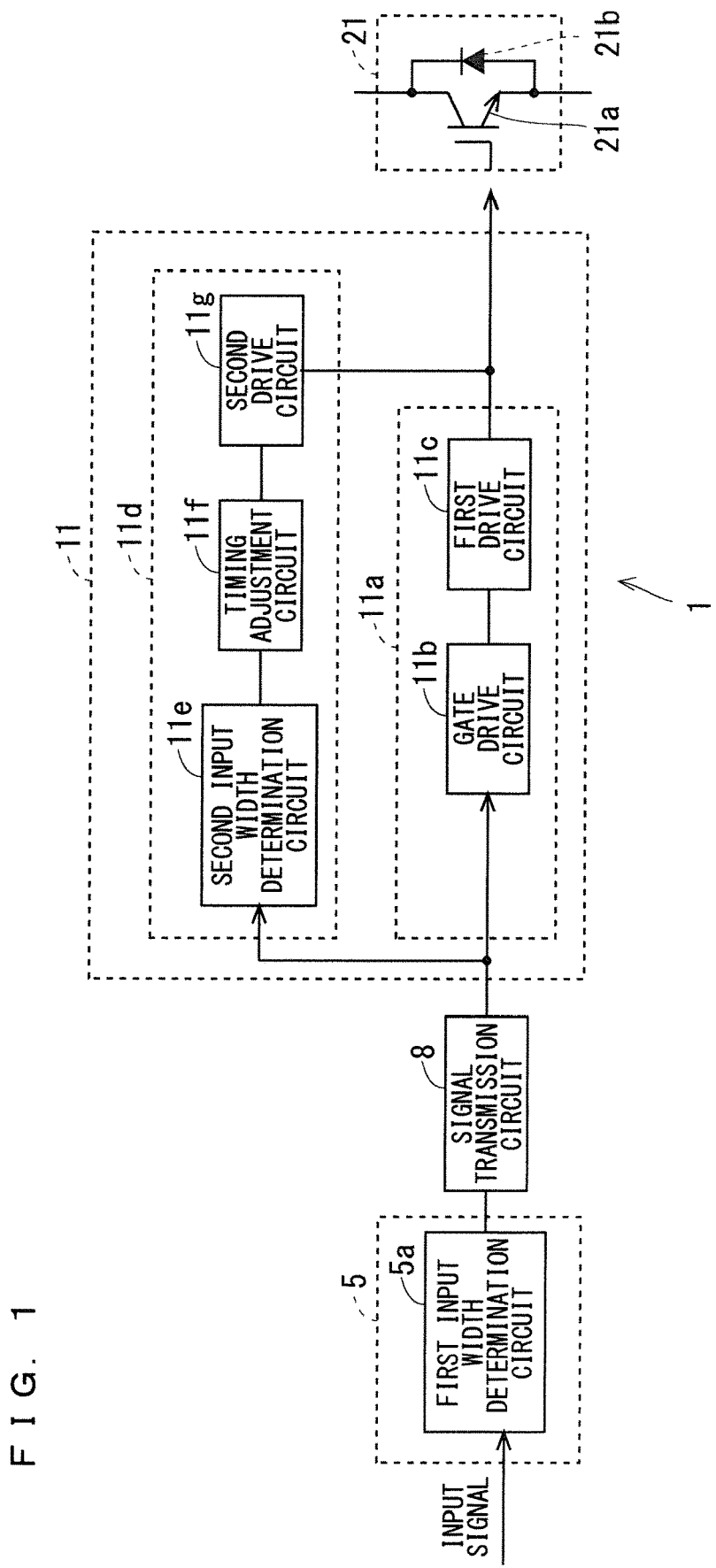
FIG. 1 is a block diagram illustrating a configuration example of a semiconductor device according to a first preferred embodiment.

Hereinafter, a preferred embodiment will be described with reference to the attached drawings. Features described in the following preferred embodiments are examples, and all features are not necessarily essential. Further, in description below, similar constituent elements in a plurality of preferred embodiments are denoted by the same or similar reference numerals, and a different constituent element will be mainly described.

First Preferred Embodiment

FIG. 1 is a block diagram illustrating a configuration example of a semiconductor device according to a first preferred embodiment. The semiconductor device of FIG. 1 includes a drive circuit 1 and a semiconductor switching element 21.

The drive circuit 1 drives the semiconductor switching element 21 by turning on and off the semiconductor switching element 21. The drive circuit 1 of FIG. 1 includes an input circuit unit 5, a signal transmission circuit 8, and a drive circuit unit 11.

The input circuit unit 5 includes a first input width determination circuit 5a that is a first determination circuit. FIG. 2 is a circuit diagram illustrating a configuration example of the first input width determination circuit 5a. The first input width determination circuit 5a of FIG. 2 includes an inverter INV11, a resistor R11, an inverter INV12, and a capacitor C11. The inverter INV11, the resistor R11, and the inverter INV12 are connected in order from the input side to the output side, and the capacitor C11 is connected between a connection point between the resistor R11 and the inverter INV12 and the ground.

FIG. 3 is a timing chart illustrating an operation example of the first input width determination circuit 5a. IN, INV11_OUT, INV12_IN, and OUT in FIG. 3 respectively represent an input of the first input width determination circuit 5a, an output of the inverter INV11, an input of the inverter INV12, and an output of the first input width determination circuit 5a. The input of the first input width determination circuit 5a corresponds to an input of the drive circuit 1 and an input of the inverter INV11, and the output of the first input width determination circuit 5a corresponds to an output of the inverter INV12. Note that, in description below, High of a signal is referred to as H, and Low of a signal is referred to as L.

When the input of the inverter INV11 becomes H, the output of the inverter INV11 becomes L, and the input of the inverter INV12 gradually becomes L from H by the resistor R11 and the capacitor C11. When the input of the inverter INV12 becomes lower than a threshold voltage INV12_Vth of the inverter INV12, the output of the inverter INV12 becomes H. In a case where a pulse width of an input signal to the first input width determination circuit 5a is small (see a right pulse of an input signal in FIG. 3), the input of the inverter INV12 is not lower than the threshold voltage INV12_Vth. Accordingly, an output signal of the first input width determination circuit 5a does not become H.

In other words, the first input width determination circuit 5a determines whether a pulse width tw of an input signal to the drive circuit 1 is larger than a first threshold t1. Then, the first input width determination circuit 5a outputs a signal of H substantially the same as the input signal when determining that the pulse width tw of the input signal is larger than the first threshold t1, and outputs a signal of L when determining that the pulse width tw is smaller than the first threshold t1.

Note that the first threshold t1 depends on a time change of the input of the inverter INV12, and depends on, for example, a resistance value of the resistor R11, the capacity of the capacitor C11, and the current capability of the inverter INV11.

When receiving an input signal in which the pulse width tw is determined to be larger than the first threshold t1 from the first input width determination circuit 5a, the signal transmission circuit 8 outputs a corresponding signal, which is a signal corresponding to the input signal, to a main circuit unit 11a and a sub-circuit unit 11d of the drive circuit unit 11. For example, in a configuration in which the signal transmission circuit 8 includes a level shift circuit, the signal transmission circuit 8 outputs a signal in which a level of a voltage or the like of a signal output from the first input width determination circuit 5a is changed as a corresponding signal.

The signal transmission circuit 8 does not need to be provided, and the corresponding signal may be a signal output from the first input width determination circuit 5a itself. In description below, in order to simplify description, a pulse width of the corresponding signal is assumed to be the same as the pulse width tw of an input signal to the drive circuit 1. However, the present invention is not limited to this.

Next, the drive circuit unit 11 will be described. The drive circuit unit 11 includes the main circuit unit 11a and the sub-circuit unit 11d.

The main circuit unit 11a includes a gate drive circuit 11b and a first drive circuit 11c. The gate drive circuit 11b charges the gate of the semiconductor switching element 21 with the current capability when the first drive circuit 11c is turned on in a case where the corresponding signal is H, and discharges the gate with the current capability when the first drive circuit 11c is turned off in a case where the corresponding signal is L.

That is, the first drive circuit 11c performs driving to turn on and off the semiconductor switching element 21 based on the corresponding signal. Note that, in a case where the pulse width tw of the input signal is smaller than the first threshold t1, the corresponding signal of H is not input to the drive circuit unit 11, and the first drive circuit 11c does not drive the semiconductor switching element 21. The same applies to a second drive circuit 11g described later.

The sub-circuit unit 11d of the drive circuit unit 11 includes a second input width determination circuit 11e that is a second determination circuit, a timing adjustment circuit 11f, and the second drive circuit 11g.

Figure 4:
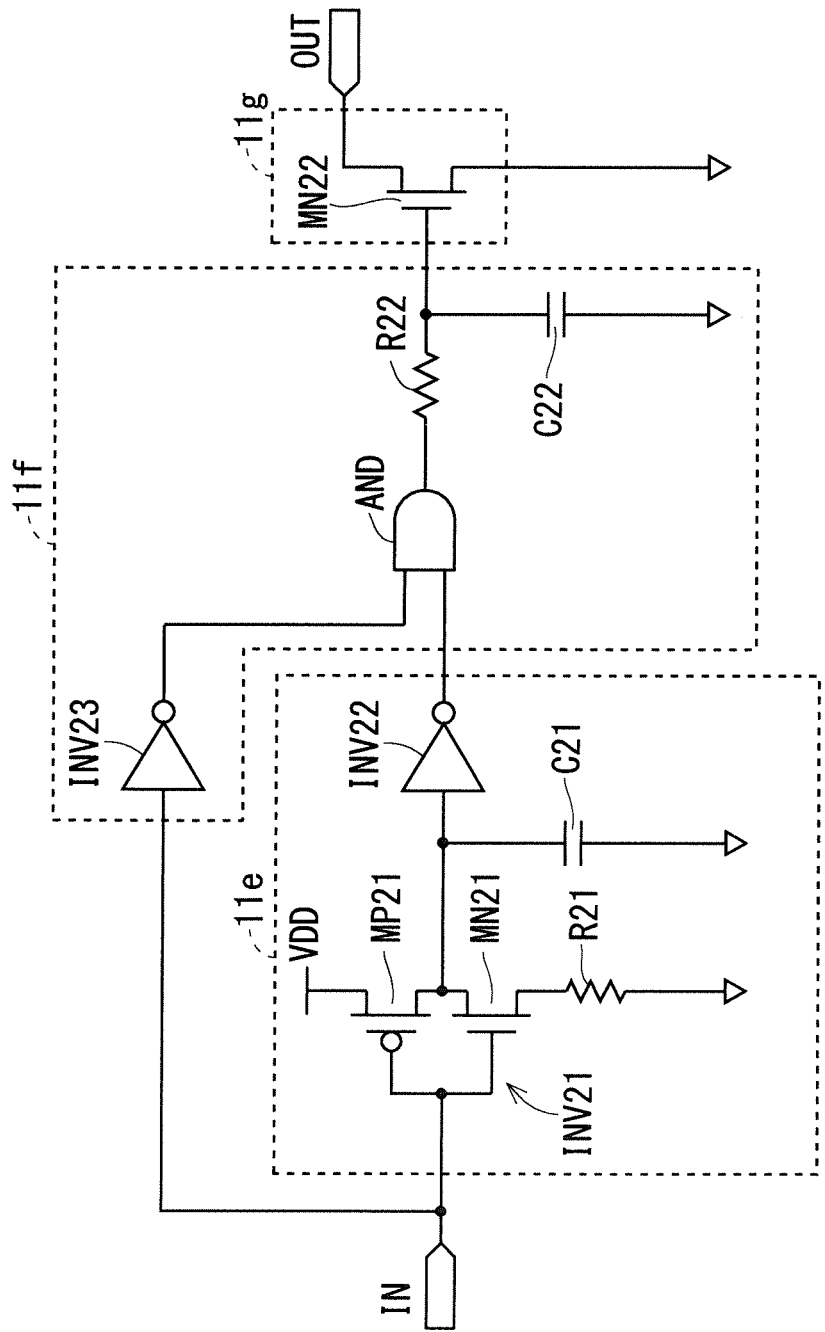
FIG. 4 is a circuit diagram illustrating a configuration example of a sub-circuit unit according to the first preferred embodiment.

FIG. 4 is a circuit diagram illustrating a configuration example of the sub-circuit unit 11d, and FIG. 5 is a timing chart illustrating an operation example of the sub-circuit unit 11d. IN, INV22_IN, INV22_OUT, and OUT in FIG. 5 represent an input of the sub-circuit unit 11d, an input of an inverter INV22, and an output of the inverter INV22, respectively. The input of the sub-circuit unit 11d corresponds to an input of an inverter INV21. INV23_OUT, AND_OUT, and MN22_IN in FIG. 5 represent an output of an inverter INV23, an output of an AND circuit AND, and an input of a semiconductor switching element MN22, respectively.

The second input width determination circuit 11e includes the inverter INV21, a resistor R21, a capacitor C21, and the inverter INV22. In the example of FIG. 4, the inverter INV21 is a CMOS inverter including a P-type MOSFET MP21 and an N-type MOSFET MN21. However, the configuration is not limited to this.

The configuration of the second input width determination circuit 11e is substantially the same as the configuration of the first input width determination circuit 5a in FIG. 2. As illustrated in FIG. 5, the inverter INV21 inverts the corresponding signal, and the capacitor C21 outputs the inverted corresponding signal having a gentle waveform to the inverter INV22. When the input of the inverter INV22 becomes lower than a threshold voltage INV22_Vth of the inverter INV22, the output of the inverter INV22 becomes H. In a case where a pulse width of the corresponding signal input to the second input width determination circuit 11e is small (see a right pulse of an input signal in FIG. 5), the input of the inverter INV22 is not lower than the threshold voltage INV22_Vth. Accordingly, an output signal of the second input width determination circuit 11e does not become H.

In other words, the second input width determination circuit 11e in FIG. 4 determines whether or not the pulse width tw of the corresponding signal is larger than a second threshold t2. Then, the second input width determination circuit 11e outputs a signal of H substantially the same as the corresponding signal when determining that the pulse width tw of the corresponding signal is larger than the second threshold t2, and outputs a signal of L when determining that the pulse width tw is smaller than the second threshold t2.

Note that the second threshold t2 depends on a time change of the input of the inverter INV22, and depends on, for example, a resistance value of the resistor R21, the capacity of the capacitor C21, and the current capability of the inverter INV21. As will be described later, the second threshold t2 may be larger than the first threshold t1 or may be the same as the first threshold t1, and which of these is realized depends on the temperature.

The timing adjustment circuit 11f of FIG. 4 includes the inverter INV23, the AND circuit AND, a resistor R22, and a capacitor C22.

The corresponding signal output from the second input width determination circuit 11e, in which the pulse width tw is determined to be larger than the second threshold t2, is slightly delayed from the corresponding signal inverted by the inverter INV23 due to the resistor R21, the capacitor C21, and the like of the second input width determination circuit 11e. That is, as illustrated in FIG. 5, INV22_OUT is slightly delayed from INV23_OUT.

The AND circuit AND generates a shot signal as indicated by AND_OUT in FIG. 5 by performing AND of the corresponding signal from the second input width determination circuit 11e and the corresponding signal from the inverter INV23. The resistor R22 and the capacitor C22 make a waveform of the shot signal generated by the AND circuit AND gentle, and output a signal having a relatively high voltage as indicated by MN22_IN in FIG. 5 obtained by the above to the second drive circuit 11g.

In other words, in a case where the pulse width tw of the corresponding signal is determined to be larger than the second threshold t2, the timing adjustment circuit 11f in FIG. 4 outputs an output signal having a relatively high voltage to the second drive circuit 11g.

The second drive circuit 11g of FIG. 4 includes the semiconductor switching element MN22. One of the source and the drain of the semiconductor switching element MN22 is connected to the ground, the other is connected to the gate of the semiconductor switching element 21 in FIG. 1, and an output signal from the timing adjustment circuit 11f is input to the gate of the semiconductor switching element MN22.

In this configuration, in a case where the output signal of the timing adjustment circuit 11f is higher than a threshold voltage MN22_Vth of the semiconductor switching element MN22, the semiconductor switching element MN22 is turned on, and the gate of the semiconductor switching element 21 is electrically connected to the ground. In this case, the gate of the semiconductor switching element 21 is discharged, the semiconductor switching element 21 is sunk, and the semiconductor switching element 21 is turned off.

In other words, in a case where the timing adjustment circuit 11f outputs an output signal having a relatively high voltage, that is, in a case where the pulse width tw of the corresponding signal is determined to be larger than the second threshold t2, the second drive circuit 11g sinks the semiconductor switching element 21. That is, in this case, the second drive circuit 11g performs driving to turn off the semiconductor switching element 21.

Here, by adjusting values of the resistor R22 and the capacitor C22 of the timing adjustment circuit 11f, it is possible to adjust a timing at which the output signal of the timing adjustment circuit 11f becomes higher than the threshold voltage MN22_Vth. That is, the timing adjustment circuit 11f can adjust a timing at which the second drive circuit 11g drives the semiconductor switching element 21 in cooperation with the first drive circuit 11c during a turn-off period of the semiconductor switching element 21 due to the drive of the first drive circuit 11c.

Note that a waveform of an output signal of the timing adjustment circuit 11f also depends on the resistor R21 and the capacitor C21 of the second input width determination circuit 11e. For this reason, the timing adjustment circuit 11f may include the resistor R21 and the capacitor C21. In such a configuration, the timing at which the second drive circuit 11g cooperates with the first drive circuit 11c can be adjusted by adjusting values of the resistor R21 and the capacitor C21. Further, in order to facilitate adjustment of the timing, a variable resistor and a variable capacitor may be used for the resistors R21 and R22 and the capacitors C21 and C22.

As described above, in a case where the pulse width tw of the corresponding signal is larger than the second threshold t2, the first drive circuit 11c and the second drive circuit 11g cooperate with each other during a turn-off period of the semiconductor switching element 21. For this reason, the sink capability, which is the drive capability, is enhanced. In contrast, in a case where the pulse width tw of the corresponding signal is smaller than the second threshold t2, only the first drive circuit 11c operates during the turn-off period of the semiconductor switching element 21. For this reason, the sink capability cannot be enhanced.

Figure 6:
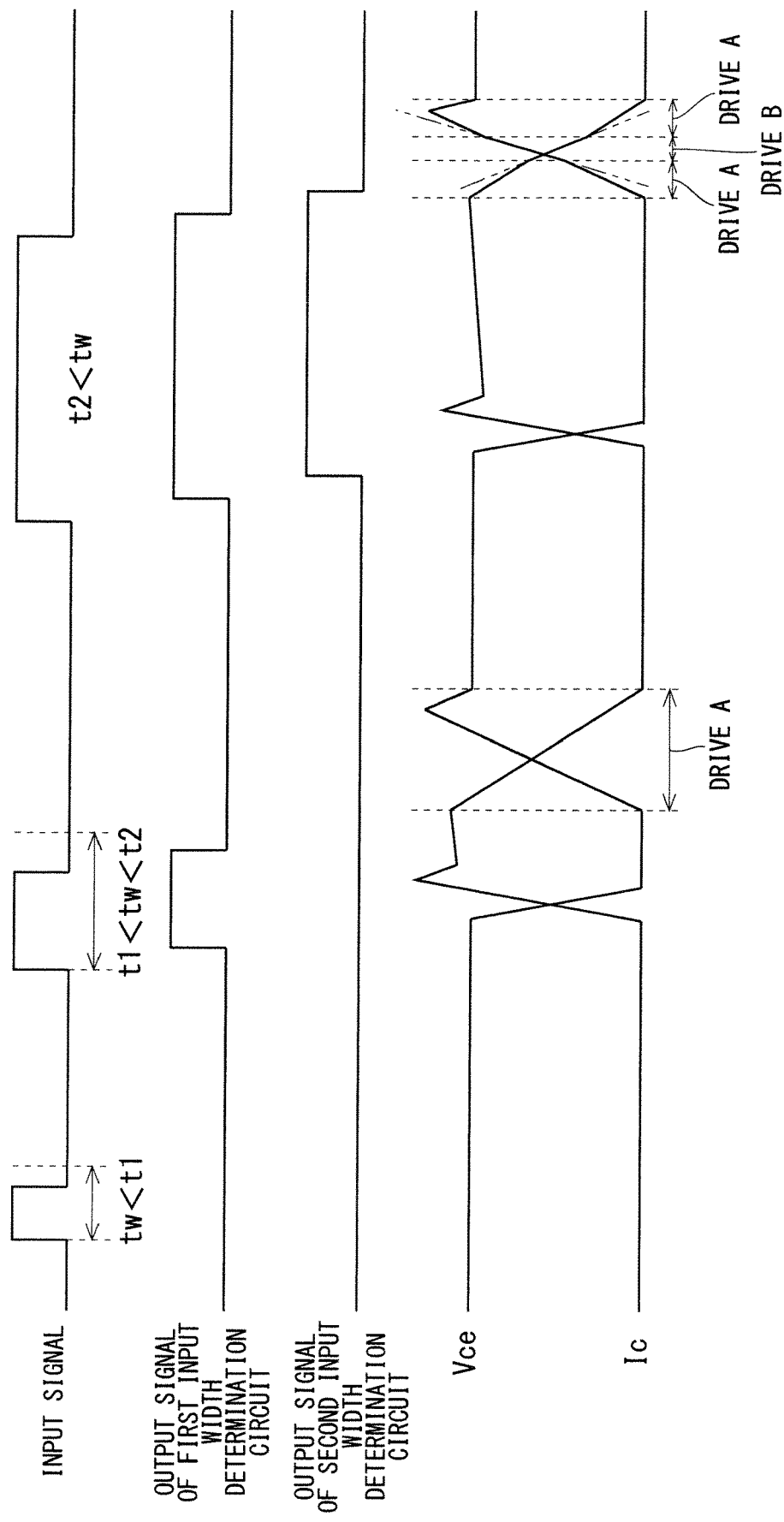
FIG. 6 is a timing chart illustrating an operation example of a drive circuit according to the first preferred embodiment.

FIG. 6 is a timing chart illustrating an operation example of the drive circuit 1 according to the first preferred embodiment. Vce represents a voltage between a collector and an emitter of the semiconductor switching element 21, and Ic represents collector current of the semiconductor switching element 21.

In a case where the pulse width tw<the first threshold t1 holds, the corresponding signal of H is not input to the drive circuit unit 11. For this reason, the first drive circuit 11c and the second drive circuit 11g do not drive the semiconductor switching element 21.

In a case where the first threshold t1<the pulse width tw<the second threshold t2 holds, drive A in which the first drive circuit 11c drives the semiconductor switching element 21 and the second drive circuit 11g does not drive the semiconductor switching element 21 is performed. In the drive A, since the sink capability cannot be enhanced, di/dt (that is, a time change in current) at the time of current interruption (that is, at the time of turn-off) becomes gentle.

In a case where the second threshold t2<the pulse width tw holds, drive B in which the first drive circuit 11c and the second drive circuit 11g cooperate with each other to drive the semiconductor switching element 21 in at least a part of the turn-off period of the semiconductor switching element 21 is performed. In the drive B, since the sink capability is enhanced, di/dt at the time of current interruption becomes steep. In the first preferred embodiment, by the adjustment of the timing adjustment circuit 11f, the second drive circuit 11g drives the semiconductor switching element 21 in a period other than the period in which a surge voltage is generated in the semiconductor switching element 21. That is, the drive B is performed in a period other than the period in which a surge voltage is generated in the semiconductor switching element 21.

Figure 7:
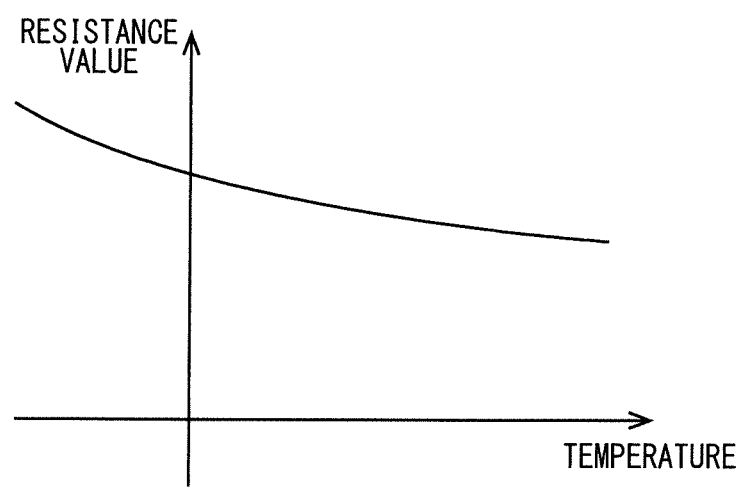
FIG. 7 is a diagram illustrating an example of temperature dependency of a resistor according to the first preferred embodiment.

FIG. 7 is a diagram illustrating an example of temperature dependency of the resistor R11 included in the first input width determination circuit 5a and the resistor R21 included in the second input width determination circuit 11e. As illustrated in FIG. 7, the resistor R11 and the resistor R21 have a negative temperature characteristic, and have a characteristic that their resistance values increase as the temperature decreases. As the resistor R11 and the resistor R21 having such a characteristic, a polysilicon resistor can be used. Note that the temperature referred to here is, for example, a temperature of the semiconductor device.

Figure 8:
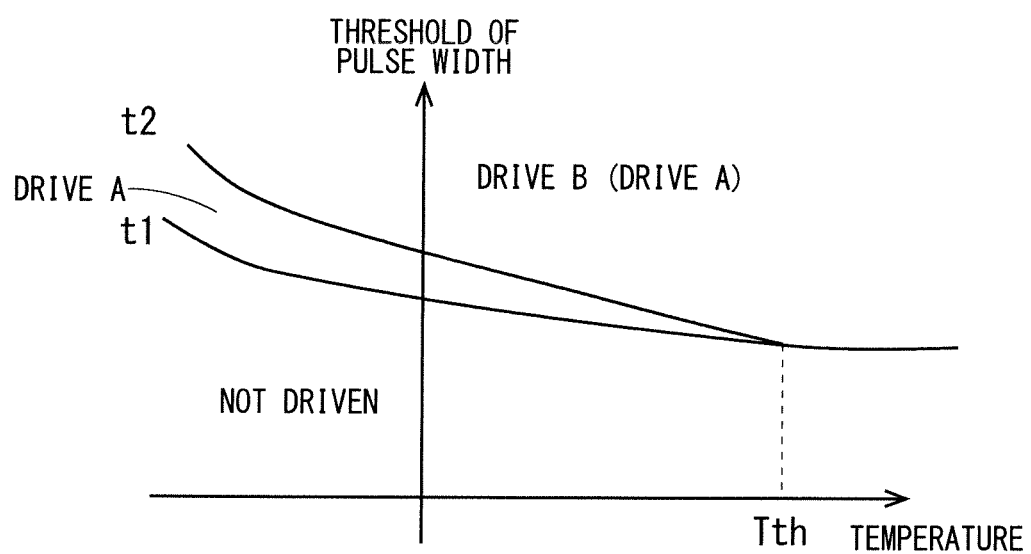
FIG. 8 is a diagram illustrating an example of temperature dependency of a first threshold and a second threshold according to the first preferred embodiment.

FIG. 8 is a diagram illustrating an example of temperature dependency of the first threshold t1 and the second threshold t2. For example, when the temperature decreases, a resistance value of the resistor R11 included in the first input width determination circuit 5a increases due to the above-described temperature dependency, and the input of the inverter INV12 further becomes gentle, and the first threshold t1 increases.

For this reason, as illustrated in FIG. 8, the first threshold t1 decreases as the temperature increases, and the first threshold t1 increases as the temperature decreases. Similarly, the second threshold t2 decreases as the temperature increases, and the second threshold t2 increases as the temperature decreases.

As described above, in the first preferred embodiment, the dependence on the temperature of the resistor R11 included in the first input width determination circuit 5a and the resistor R21 included in the second input width determination circuit 11e is reflected on the dependence on the temperature of the first threshold t1 and the second threshold t2. Note that, in the example of FIG. 8, when the temperature exceeds a predetermined threshold Tth, the first threshold t1 and the second threshold t2 become equal. For this reason, when the temperature exceeds the predetermined threshold Tth, the drive B is always performed, and a situation where only the drive A is performed is suppressed.

Next, the semiconductor switching element 21 of FIG. 1 driven by the drive circuit 1 will be described. In the first preferred embodiment, the semiconductor switching element 21 is described as an insulated gate bipolar transistor (IGBT) including a metal oxide semiconductor field effect transistor (MOSFET) 21a and a freewheeling diode 21b. However, the present invention is not limited to this. For example, the semiconductor switching element 21 may be, for example, a MOSFET or a reverse conducting IGBT (RC-IGBT). Further, for example, the freewheeling diode 21b may be a PN junction diode (PND) or a Schottky barrier diode (SBD).

The material of the semiconductor switching element 21 may be general silicon (Si) or a wide bandgap semiconductor. The wide bandgap semiconductor includes, for example, silicon carbide (SiC), gallium nitride (GaN), and diamond. In a case where the material of the semiconductor switching element 21 is a wide bandgap semiconductor, stable operation under high temperature and high voltage, and high switching speed can be achieved.

FIG. 9 is a diagram illustrating an example of a temperature characteristic of a withstand voltage (that is, a breakdown voltage) of the semiconductor switching element 21 according to the first preferred embodiment. In the first preferred embodiment, as the temperature of the semiconductor switching element 21 increases, the withstand voltage of the semiconductor switching element 21 increases.

Summary of First Preferred Embodiment

According to the first preferred embodiment as described above, the timing at which the second drive circuit 11g cooperates with the first drive circuit 11c to drive the semiconductor switching element 21 during the turn-off period of the semiconductor switching element 21 due to the drive of the first drive circuit 11c is adjusted. In this manner, the timing and the period of the drive B in which the sink capability is relatively high and the drive A in which the sink capability is relatively low can be adjusted. Accordingly, it is possible to appropriately achieve both the reduction of a switching loss and the suppression of a surge voltage at the time of turn-off.

Further, in the first preferred embodiment, the first threshold t1 and the second threshold t2 decrease as the temperature increases. In this manner, driving of the semiconductor switching element 21 at a high frequency is suppressed in a case where the temperature is high. Accordingly, heat generation of the semiconductor switching element 21 can be suppressed.

Further, in the first preferred embodiment, when the temperature exceeds the predetermined threshold Tth, the first threshold t1 and the second threshold t2 become equal. In this manner, when the temperature exceeds the predetermined threshold Tth, the drive B in which the sink capability is relatively high is always performed, so that it is possible to suppress a switching loss that becomes a problem at the time of high temperature.

Further, in the first preferred embodiment, the dependence on the temperature of the resistors R11 and R21 is reflected on the dependence on the temperature of the first threshold t1 and the second threshold t2. In this manner, it is not necessary to use a dedicated temperature sensor such as a thermistor or a thermocouple, and the cost of the temperature sensor can be reduced.

Further, in the first preferred embodiment, the second drive circuit 11g drives the semiconductor switching element 21 in a period other than the period in which a surge voltage is generated in the semiconductor switching element 21. In this manner, since the drive B in which the sink capability is relatively high is not performed during the period in which surge voltage is generated, suppression of a surge voltage at turn-off can be enhanced.

Further, in the first preferred embodiment, a withstand voltage of the semiconductor switching element 21 increases as the temperature increases. In this manner, even if only the drive B in which the sink capability is relatively high is performed at a high temperature and a surge voltage becomes high, the withstand voltage of the semiconductor switching element 21 becomes high, so that a failure due to the surge voltage can be suppressed.

Second Preferred Embodiment

Figure 10:
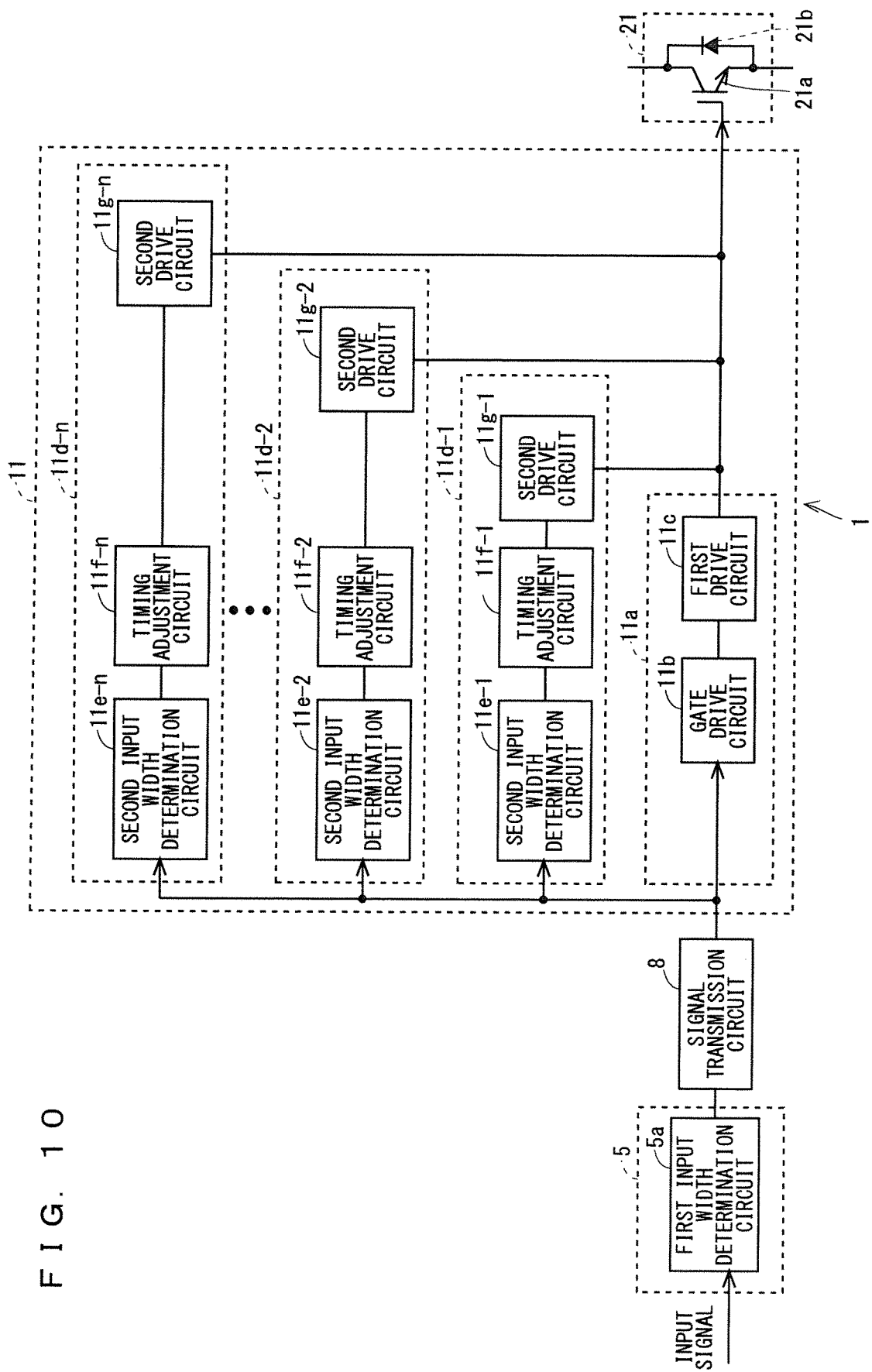
FIG. 10 is a block diagram illustrating a configuration example of the semiconductor device according to the second preferred embodiment.

FIG. 10 is a block diagram illustrating a configuration example of the semiconductor device according to a second preferred embodiment. The semiconductor device of FIG. 10 includes second input width determination circuits 11e-1 to 11e-n, timing adjustment circuits 11f-1 to 11f-n, and second drive circuits 11g-1 to 11g-n.

The second input width determination circuits 11e-1 to 11e-n, the timing adjustment circuits 11f-1 to 11f-n, and the second drive circuits 11g-1 to 11g-n are provided as a plurality of sets (n sets in FIG. 10) of the second input width determination circuit 11e, the timing adjustment circuit 11f, and the second drive circuit 11g. Then, the second thresholds t2 of the second input width determination circuits 11e in different sets are different from each other.

Here, in general, the surge voltage of the semiconductor switching element 21 tends to be higher as the pulse width tw of the input signal is smaller. According to the semiconductor device according to the second preferred embodiment, since the sink capability can be finely changed according to the pulse width tw of the input signal, it is possible to more appropriately achieve both the reduction of a switching loss and the suppression of a surge voltage at turn-off.

Note that drive timings of the semiconductor switching element 21 adjusted by the timing adjustment circuits 11f in different sets may also be different from each other. In this case, the sink capability can be changed more finely.

Note that the preferred embodiments and the variations can be freely combined, and the preferred embodiments and the variations can be appropriately modified or omitted.

While the disclosure has been shown and described in detail, the foregoing description is in all aspects illustrative and not restrictive. It is therefore understood that numerous modifications and variations can be devised.

What is claimed is:

1. A drive circuit that drives a semiconductor switching element, the drive circuit comprising:
    a first determination circuit that determines whether or not a pulse width of an input signal to the drive circuit is larger than a first threshold;
    a first drive circuit that drives the semiconductor switching element based on a corresponding signal that is a signal corresponding to the input signal in which the pulse width is determined to be larger than the first threshold;
    one or more second determination circuits that determine whether or not a pulse width of the corresponding signal is larger than a second threshold;
    one or more second drive circuits that drive the semiconductor switching element in a case where the pulse width of the corresponding signal is determined to be larger than the second threshold; and
    one or more timing adjustment circuits that adjust a timing at which the one or more second drive circuits cooperate with the first drive circuit to drive the semiconductor switching element during a turn-off period of the semiconductor switching element due to drive of the first drive circuit.

2. The drive circuit according to claim 1, wherein the first threshold and the second threshold depend on a temperature.

3. The drive circuit according to claim 2, wherein
    the pulse width of the corresponding signal is same as the pulse width of the input signal,
    the second threshold is more than or equal to the first threshold, and
    the first threshold and the second threshold decrease as the temperature increases.

4. The drive circuit according to claim 2, wherein
    the pulse width of the corresponding signal is same as the pulse width of the input signal,
    the second threshold is more than or equal to the first threshold, and
    the first threshold and the second threshold become equal as the temperature exceeds a predetermined threshold.

5. The drive circuit according to claim 2, wherein
    dependency on the temperature of a resistor included in the first determination circuit and a resistor included in the second determination circuit is reflected on dependency on the temperature of the first threshold and the second threshold.

6. The drive circuit according to claim 1, wherein
    the second drive circuit drives the semiconductor switching element in a period other than a period in which a surge voltage is generated in the semiconductor switching element by adjustment of the timing adjustment circuit.

7. The drive circuit according to claim 1, wherein
    the one or more second determination circuits, the one or more timing adjustment circuits, and the one or more second drive circuits are provided as a plurality of sets of the second determination circuit, the timing adjustment circuit, and the second drive circuit, and
    the second thresholds of the second determination circuits in different sets are different from each other.

8. A semiconductor device comprising:
    the drive circuit according to claim 1; and
    the semiconductor switching element, wherein
    a withstand voltage of the semiconductor switching element increases as a temperature of the semiconductor switching element increases.

* * * * *